United States Patent
Cao et al.

(10) Patent No.: US 9,467,954 B2
(45) Date of Patent: Oct. 11, 2016

(54) POWER ADJUSTMENT METHOD AND APPARATUS BASED ON LOW DELAY POWER DETECTION BEFORE DPD

(71) Applicant: ZTE CORPORATION, Shenzhen, Guangdong (CN)

(72) Inventors: Zhen Cao, Shenzhen (CN); Hao Qiu, Shenzhen (CN); Wei Chen, Shenzhen (CN); Cong Xiao, Shenzhen (CN); Xuelong Yuan, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 0 days.

(21) Appl. No.: 14/762,968

(22) PCT Filed: Oct. 14, 2013

(86) PCT No.: PCT/CN2013/085188
§ 371 (c)(1),
(2) Date: Jul. 23, 2015

(87) PCT Pub. No.: WO2014/117540
PCT Pub. Date: Aug. 7, 2014

(65) Prior Publication Data
US 2015/0341868 A1 Nov. 26, 2015

(30) Foreign Application Priority Data

Jan. 29, 2013 (CN) .......................... 2013 1 0034381

(51) Int. Cl.
*H04W 52/30* (2009.01)
*H04W 52/18* (2009.01)
(Continued)

(52) U.S. Cl.
CPC ............ *H04W 52/30* (2013.01); *H03F 1/3223* (2013.01); *H03F 1/3241* (2013.01); *H03F 3/195* (2013.01);
(Continued)

(58) Field of Classification Search
CPC .... H03F 1/3223; H03F 1/3241; H03F 3/195; H03F 3/24; H04B 17/364; H04L 27/2614; H04L 27/367; H04W 52/18; H04W 52/30; H04W 52/52; Y02B 60/50

USPC .......... 455/101, 103, 522, 108, 114.2, 114.3, 455/126, 127.1, 69; 375/147, 233, 296, 375/297, 224, 345, 260, 219, 295; 708/300; 330/149, 291
See application file for complete search history.

(56) References Cited

U.S. PATENT DOCUMENTS 8,285,770 B1 * 10/2012 Barnes .................. H03F 1/3247
708/300
8,446,979 B1 * 5/2013 Yee ....................... H04L 27/368
375/219

(Continued)

FOREIGN PATENT DOCUMENTS

| CN | 101789923 A | 7/2010 |
| CN | 101908861 A | 12/2010 |

(Continued)

OTHER PUBLICATIONS

Supplementary European Search Report in European application No. 13874165.7, mailed on Oct. 30, 2015.
(Continued)

*Primary Examiner* — Tan H Trinh
(74) *Attorney, Agent, or Firm* — LeClairRyan, a Professional Corporation

(57) ABSTRACT

Disclosed are a power adjustment method and an apparatus based on low delay power detection before digital pre-distortion. The method comprises the following steps: according to pre-configured system carrier information, obtaining effective carrier information containing an effective carrier channel corresponding to each effective carrier; performing sampling on carrier data of each effective carrier channel according to the obtained effective carrier information, and then calculating combination power Pa of effective carriers before digital up conversion or digital peak clipping cancellation according to the sampling; and using the combination power Pa of the effective carriers to perform power adjustment before digital pre-distortion. The present invention moves power calculation ahead of an up conversion module, fully utilizes inherent delay of digital up conversion and a peak clipping module to offset time required for the power calculation, and effectively reduces system delay.

11 Claims, 2 Drawing Sheets

(51) Int. Cl.
*H04W 52/52* (2009.01)
*H04B 17/364* (2015.01)
*H03F 1/32* (2006.01)
*H03F 3/195* (2006.01)
*H03F 3/24* (2006.01)
*H04L 27/26* (2006.01)
*H04L 27/36* (2006.01)

(52) U.S. Cl.
CPC .............. *H03F 3/24* (2013.01); *H04B 17/364* (2015.01); *H04L 27/2614* (2013.01); *H04L 27/367* (2013.01); *H04W 52/18* (2013.01); *H04W 52/52* (2013.01); *Y02B 60/50* (2013.01)

(56) References Cited

U.S. PATENT DOCUMENTS

| 8,982,995 | B1* | 3/2015 | Van Cai | H04B 1/0475 375/297 |
|---|---|---|---|---|
| 2004/0170228 | A1* | 9/2004 | Vadde | H04L 25/497 375/260 |
| 2005/0195919 | A1* | 9/2005 | Cova | H03F 1/3258 375/297 |
| 2008/0057880 | A1* | 3/2008 | Copeland | H04B 7/0691 455/101 |
| 2008/0265996 | A1* | 10/2008 | Kim | H03F 1/3247 330/291 |
| 2009/0191910 | A1* | 7/2009 | Athalye | H04W 52/16 455/522 |
| 2010/0225389 | A1* | 9/2010 | Teetzel | H03F 1/3211 330/149 |
| 2010/0311360 | A1 | 12/2010 | Huang et al. | |
| 2011/0080216 | A1* | 4/2011 | Mujica | H03F 1/3247 330/149 |
| 2011/0286497 | A1* | 11/2011 | Nervig | H04L 5/0021 375/147 |
| 2012/0134399 | A1* | 5/2012 | Gandhi | H03G 3/3042 375/224 |
| 2012/0155572 | A1* | 6/2012 | Kim | H03F 1/3247 375/297 |
| 2012/0321018 | A1* | 12/2012 | Chen | H03F 1/3247 375/296 |
| 2013/0070870 | A1* | 3/2013 | Pashay-Kojouri | H03F 3/193 375/296 |
| 2015/0381220 | A1* | 12/2015 | Gal | H04B 1/0475 375/296 |
| 2016/0087657 | A1* | 3/2016 | Yu | H04B 1/0475 375/297 |

FOREIGN PATENT DOCUMENTS

| JP | 2003078359 | A | 3/2003 |
|---|---|---|---|
| JP | 2005253117 | A | 9/2005 |
| JP | 2006067073 | A | 3/2006 |
| JP | 2007194825 | A | 8/2007 |
| JP | 2007267345 | A | 10/2007 |
| JP | 2010154321 | A | 7/2010 |

OTHER PUBLICATIONS

International Search Report in international application No. PCT/CN2013/085188, mailed on Jan. 16, 2014.
English Translation of the Written Opinion of the International Search Authority in international application No. PCT/CN2013/085188, mailed on Jan. 16, 2014.
Office Action from Japan Patent Application 2015-554019 (PCT/CN2013/085188), Aug. 9, 2016, pp. 1-4.

* cited by examiner

POWER ADJUSTMENT METHOD AND APPARATUS BASED ON LOW DELAY POWER DETECTION BEFORE DPD

This application is a national stage application under 35 U.S.C. §371 from PCT Application No. PCT/CN2013/085188, filed Oct. 14, 2013, which claims the priority benefit of China Application No. 201310034381.0, filed Jan. 29, 2013.

TECHNICAL FIELD

The disclosure relates to the field of wireless communication technology, and in particular to a method and apparatus for power adjustment based on low-delay power detection before Digital Pre-Distortion (DPD).

BACKGROUND

A Remote Radio unit is a vital part of an existing wireless communication system, in particular a third or fourth generation mobile communication system. A DPD module is a core part of a Remote Radio unit. An index of the DPD module is directly related to maximal transmit power of the Remote Radio unit, and thus impacts a coverage radius of a cell as well as an access index of a terminal.

An existing DPD module is in general based on a structure of a search table. However, before the table is searched, power of data input to the module has to be computed, such that content of an entry can be determined. Such a power detecting module will introduce a large delay as well as substantial computation. The delay will impact a delay index of the Remote Radio unit, increasing system cache for delay. The substantial computation will increase computation cost of the Remote Radio unit.

SUMMARY

Embodiments herein provide a method and apparatus for power adjustment based on low-delay power detection before DPD, capable of effectively lowering a system delay and reducing computation.

To this end, a technical solution according to an embodiment herein may be implemented as follows.

According to an embodiment herein, a method for power adjustment based on low-delay power detection before Digital Pre-Distortion (DPD), includes steps of:

obtaining, according to preconfigured system carrier information, effective carrier information including an effective carrier channel corresponding to an effective carrier;

sampling, according to the obtained effective carrier information, carrier data on an effective carrier channel, and then determining, according to sampled carrier data on effective carrier channels, total power Pa of effective carriers before Digital Up Conversion (DUC) or before digital Crest Factor Reduction (CFR); and before DPD, performing power adjustment using the total power Pa of the effective carriers.

The sampling, according to the obtained effective carrier information, carrier data on an effective carrier channel may include:

selecting data sample points corresponding to a carrier data rate used; and sampling, at the data sample points, carrier data before DUC on an effective carrier channel.

The sampling, according to the obtained effective carrier information, carrier data on an effective carrier channel may include:

selecting data sample points according to a carrier data rate and a DUC interpolation multiple; and sampling, at the data sample points, carrier data after DUC on an effective carrier channel.

The determining, according to sampled carrier data on effective carrier channels, total power Pa of effective carriers before Digital Up Conversion (DUC) or before digital Crest Factor Reduction (CFR) may include:

calculating, using power of sampled carrier data at the data sample points on an effective carrier channel, average carrier power of the effective carrier channel; and obtaining the total power Pa of the effective carriers by summing the average carrier power over the effective carrier channels.

The determining, according to sampled carrier data on effective carrier channels, total power Pa of effective carriers before Digital Up Conversion (DUC) or before digital Crest Factor Reduction (CFR) may include:

obtaining total power of the effective carriers at a data sample point by summing power of carrier data sampled at the data sample point over the effective carrier channels; and obtaining the total power Pa of the effective carriers by averaging the total power of the effective carriers at the data sample points.

The before DPD, performing power adjustment using the total power Pa of the effective carriers may include:

searching a power compensating search table made beforehand for a compensating entry Ga corresponding to the total power Pa of the effective carriers;

determining, according to the found compensating entry Ga, an adjusted power value; and sending the adjusted power value into a DPD module; performing, by the DPD module, power adjustment according to the adjusted power value, such that power loss due to peak elimination by a CFR module of a Remote Radio unit is compensated.

The adjusted power value may be a product of the total power Pa of the effective carriers and the compensating entry Ga.

According to an embodiment herein, an apparatus for power adjustment based on low-delay power detection before Digital Pre-Distortion (DPD) includes:

a configuring module configured for: obtaining, according to preconfigured system carrier information, effective carrier information including an input data channel corresponding to an effective carrier;

a sampling computing module configured for: sampling, according to the obtained effective carrier information, carrier data on an effective carrier channel, and then determining, according to carrier data on effective carrier channels, total power Pa of effective carriers before Digital Up Conversion (DUC) or before digital Crest Factor Reduction (CFR); and an adjusting module configured for: before DPD, performing power adjustment using the total power Pa of the effective carriers.

The sampling computing module may include:

a sampling module configured for: selecting data sample points corresponding to a carrier data rate used, and sampling, at the data sample points, carrier data before DUC on an effective carrier channel; and a total power computing module configured for: determining, according to the sampled carrier data on the effective carrier channels, the total power Pa of the effective carriers before DUC or before Digital CFR.

The sampling computing module may include:

a sampling module configured for: selecting data sample points according to a carrier data rate and a DUO interpolation multiple, and sampling, at the data sample points, carrier data after DUO on an effective carrier channel; and a total power computing module configured for: determining, according to the sampled carrier data on the effective carrier channels, the total power Pa of the effective carriers before DUO or before Digital CFR.

Compared with an existing solution, a technical solution provided herein has beneficial effects as follows.

1, power computation is moved forward, ahead of an Up Conversion module; inherent delays of DUO and CFR modules may be fully exploited to cancel out an amount of time as required by power computation, such that a system delay may be lowered effectively, in theory lowering the delay to L/fb.

2, an amount of computation as required by power computation may be greatly lowered, too. The amount of computation as required herein may be M*fb, whereas N*fb will be required with a convention solution. The N may be an Up Conversion interpolation multiple. In general, the N is far greater than the M.

DETAILED DESCRIPTION

An embodiment herein will be elaborated below with reference to the accompanying drawing. Note that an embodiment illustrated below is for illustrating and explaining the disclosure only, and is not intended to limit the disclosure.

Embodiments herein are directed at improving a power detecting module in DPD, so as to reduce a delay and amount of computation.

Figure 1:
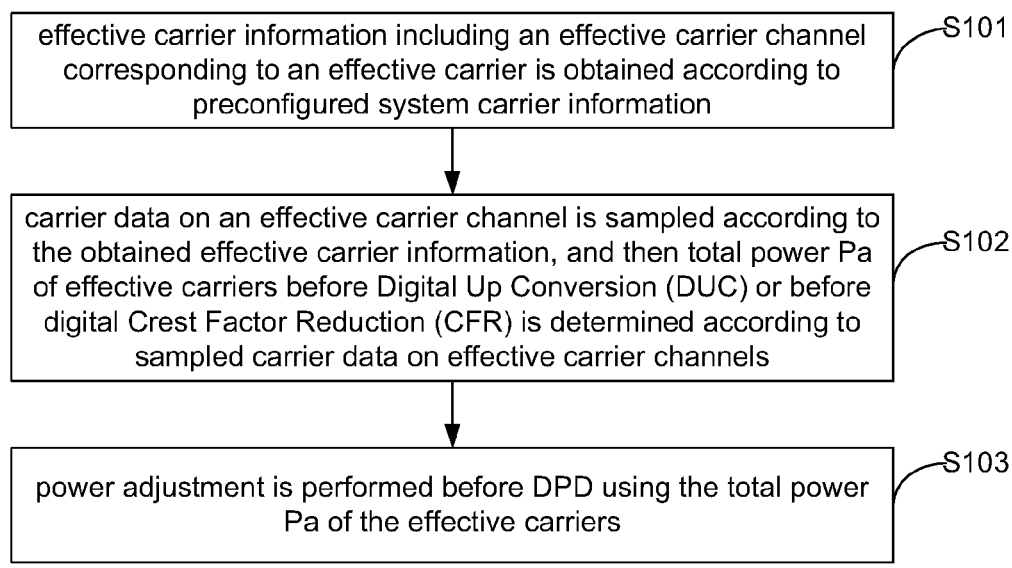
FIG. 1 is a flowchart of a method for power adjustment based on low-delay power detection before DPD according to an embodiment herein.

FIG. 1 is a flowchart of a method for power adjustment based on low-delay power detection before DPD according to an embodiment herein. As shown in FIG. 1, the method includes steps as follows.

In step S101, effective carrier information including an effective carrier channel corresponding to an effective carrier is obtained according to preconfigured system carrier information.

In step S102, carrier data on an effective carrier channel is sampled according to the obtained effective carrier information, and then total power Pa of effective carriers before Digital Up Conversion (DUC) or before digital Crest Factor Reduction (CFR) is determined according to sampled carrier data on effective carrier channels.

In step S103, power adjustment is performed before DPD using the total power Pa of the effective carriers.

The carrier data on an effective carrier channel may be sampled according to the obtained effective carrier information by: selecting data sample points corresponding to a carrier data rate used; and sampling, at the data sample points, carrier data before DUC on an effective carrier channel.

The carrier data on an effective carrier channel may be sampled according to the obtained effective carrier information by: selecting data sample points according to a carrier data rate and a DUC interpolation multiple; and sampling, at the data sample points, carrier data after DUC on an effective carrier channel.

The total power Pa of the effective carriers before DUC or before digital CFR may be determined by: calculating, using power of sampled carrier data at the data sample points on an effective carrier channel, average carrier power of the effective carrier channel; and obtaining the total power Pa of the effective carriers by summing the average carrier power over the effective carrier channels.

The total power Pa of the effective carriers before DUC or before digital CFR may be determined by: obtaining total power of the effective carriers at a data sample point by summing power of carrier data sampled at the data sample point over the effective carrier channels; and obtaining the total power Pa of the effective carriers by averaging the total power of the effective carriers at the data sample points.

Power adjustment may be performed before DPD using the total power Pa of the effective carriers by: searching a power compensating search table made beforehand for a compensating entry Ga corresponding to the total power Pa of the effective carriers; determining, according to the found compensating entry Ga, an adjusted power value; sending the adjusted power value into a DPD module; performing, by the DPD module, power adjustment according to the adjusted power value, such that power loss due to peak elimination by a CFR module of a Remote Radio unit is compensated.

The adjusted power value may be a product of the total power Pa of the effective carriers and the compensating entry Ga.

Figure 2:
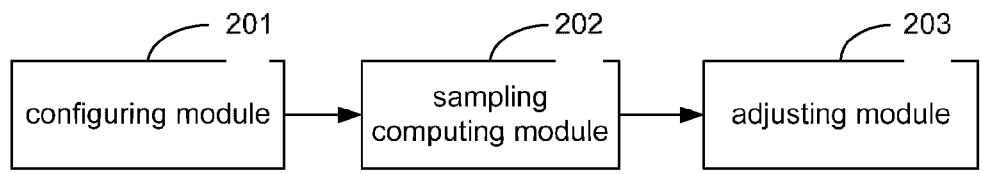
FIG. 2 is a diagram of an apparatus for power adjustment based on low-delay power detection before DPD according to an embodiment herein.

FIG. 2 is a diagram of an apparatus for power adjustment based on low-delay power detection before DPD according to an embodiment herein. As shown in FIG. 2, the apparatus includes a configuring module, a sampling computing module, and an adjusting module. The configuring module 201 may be configured for: obtaining, according to preconfigured system carrier information, effective carrier information including an input data channel corresponding to an effective carrier. The sampling computing module 202 may be configured for: sampling, according to the obtained effective carrier information, carrier data on an effective carrier channel, and then determining, according to sampled carrier data on effective carrier channels, total power Pa of effective carriers before Digital Up Conversion (DUC) or before digital Crest Factor Reduction (CFR). The adjusting module 203 may be configured for: before DPD, performing power adjustment using the total power Pa of the effective carriers.

The sampling computing module 202 may include: a sampling module configured for: selecting data sample points corresponding to a carrier data rate used, and sampling, at the data sample points, carrier data before DUC on an effective carrier channel; and a total power computing module configured for: determining, according to the sampled carrier data on the effective carrier channels, the total power Pa of the effective carriers before DUC or before Digital CFR.

The sampling computing module may include: a sampling module configured for: selecting data sample points according to a carrier data rate and a DUC interpolation multiple, and sampling, at the data sample points, carrier data after DUC on an effective carrier channel; and a total power computing module configured for: determining, according to the sampled carrier data on the effective carrier channels, the total power Pa of the effective carriers before DUO or before Digital CFR.

In practical application, the apparatus for power adjustment based on low-delay power detection before DPD may be deployed in a Remote Radio unit in a wireless communication system. Each of the configuring module 201, the sampling computing module 202, and the adjusting module 203 may be implemented by a CPU, a Digital Signal Processor (DSP), or a Field Programmable Gate Array (FPGA) of the Remote Radio unit.

Figure 3:
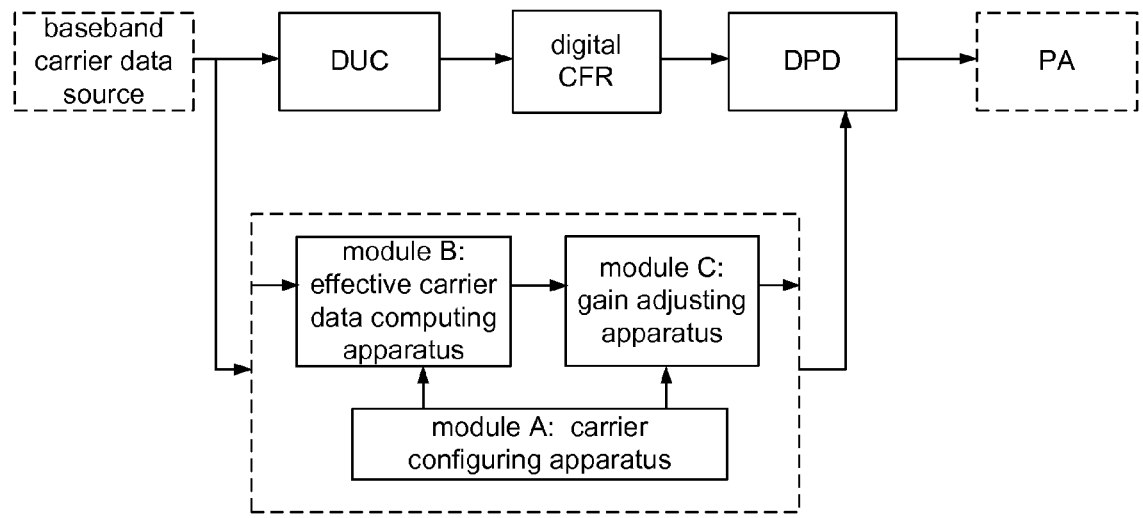
FIG. 3 is a block diagram of a structure of a method for low-delay power detection before DPD according to an embodiment herein.

FIG. 3 is a block diagram of a structure of a method for low-delay power detection before DPD according to an embodiment herein. As shown in FIG. 3, the structure may include modules A-C. The module A may be a carrier configuring apparatus providing the effective carrier information. The effective carrier information may include a number of information-bearing effective carriers in the system and input data channels each corresponding to an effective carrier. The effective carrier information may be available through upper layer software configuration. The module B may be an effective carrier data computing apparatus which may calculate average effective carrier power corresponding to the information provided by the apparatus A. The module C may be a gain adjusting apparatus which may compensate a power difference introduced by peak elimination by a next-stage CFR module.

The module A may provide effective filtering information specifically through steps as follows.

In step A1, a maximal number Mmax of carrier channels in the system may be determined.

In step A2, a channel number (0, 1, 2, . . . , Mmax−1) corresponding to a carrier channel may be determined.

In step A3, a number M of system-configured carrier channels may be determined, with M≤Mmax.

In step A4, a channel number 0, 1, 2, . . . , M−1 of a configured effective carrier channel may be determined.

The module B may calculate the average effective carrier power corresponding to the information provided by the apparatus A with steps as follows.

In step B1, an input carrier data rate fb and a computing rate fm of the apparatus may be selected. fm=K*fb, with K=M, such that computing efficiency may be improved effectively while avoiding computation waste.

In step B2, a data sample length (or data sample points), denoted by L, may be selected.

In step B3, according to effective carrier information configured in A, (L-points) sampling may be performed respectively and carrier power p0, p1, p2, . . . , pM−1 corresponding to the channel numbers 0, 1, 2, . . . , M−1 of the effective carrier channels may be computed.

In step B4, the total power of all the effective carriers may be computed.

The module C may compensate the power difference introduced by peak elimination by the next-stage CFR module through steps as follows.

In step C1, a power compensating search table may be made according to carrier configuration in A and a maximal total power Pmax allowed by the system. The power compensating search table may be obtained by traversing different carrier power configurations through algorithm simulation.

In step C2, a compensating entry Ga in C1 may be found according to a result Pa calculated in B.

In step C3, an adjusted power value may be obtained as a product of Ga and Pa, and sent into a DPD module.

A specific embodiment according to FIG. 3 will be elaborated below.

In step A1, a maximal number Mmax of carrier channels in the system may be determined. Mmax=12, for example.

In step A2, a channel number (0, 1, 2, . . . , 11) corresponding to a carrier channel may be determined.

In step A3, a number M of system-configured carrier channels may be determined. M=6, for example.

In step A4, a channel number 0, 1, 2, 3, 4, 5 of a configured effective carrier channel may be determined.

In step B1, a carrier data rate fb=1.28 MHz may be selected. As M=6, a computing rate fm of the apparatus=6*fb=7.68 MHz may be selected.

In step B2, a data sample length L=128 (under rate fb) may be selected.

In step B3, according to effective carrier information configured in A, 128-pt sampling may be performed respectively and carrier power p0, p1, p2, . . . , p5 corresponding to channel numbers 0, 1, 2, . . . , 5 of the effective carrier channels may be computed.

In step B4, the total power of all the effective carriers may be computed. Assume that Pa=−16 dbfs, for example. Note that steps B3 and B4 may also be broken down into summing over 6 carrier data samples at a data sample point (and the rate fm may be fully exploited), and then averaging 128 data sample points.

In step C1, a power compensating search table may be made according to carrier configuration in A and a maximal total power Pmax allowed by the system. Assume that M=6, Pmax=−15 dbfs, for example. An inter-entry difference may be 0.1 dB, with a total of 150 entries. (With a total power less than −30 dbfs, no CFR is performed, as it is deemed that no adjustment is required.)

In step C2, a compensating entry Ga=0.9968 in C1 may be found according to a result Pa=−16 dbfs calculated in B.

In step C3, an adjusted power value Po=−16.028 dbfs may be obtained as a product of Ga=0.9968 and Pa=−16 dbfs, and sent into a DPD module.

Figure 4:
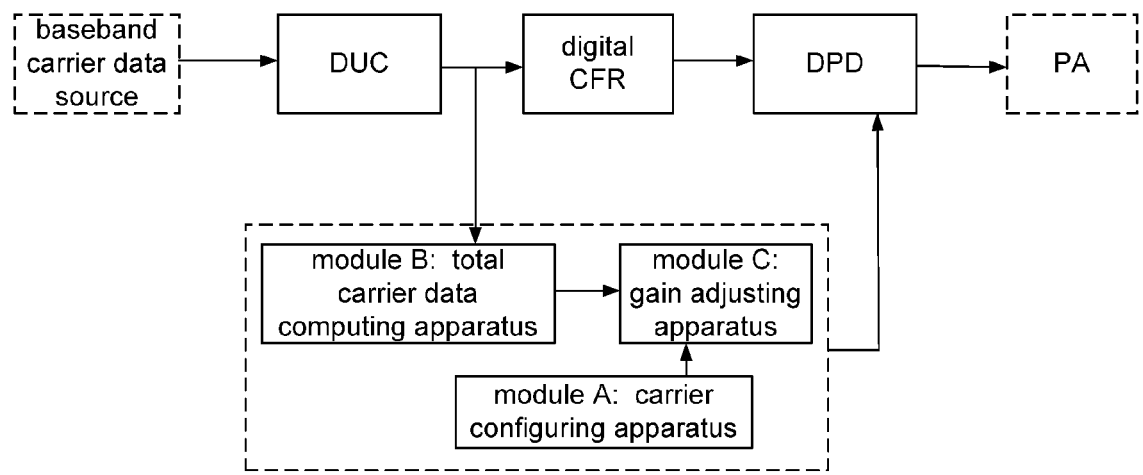
FIG. 4 is a block diagram of a structure of a method for low-delay power detection before DPD according to an embodiment herein.

FIG. 4 is a block diagram of a structure of a method for low-delay power detection before DPD according to an embodiment herein. As shown in FIG. 4, the structure may include steps as follows.

In step A1, a maximal number Mmax of carrier channels in the system may be determined. Mmax=12, for example.

In step A2, a channel number (0, 1, 2, . . . , 11) corresponding to a carrier channel may be determined.

In step A3, a number M of system-configured carrier channels may be determined. M=12, for example.

In step A4, a channel number 0, 1, 2, 3, 4, 5, 6, 7, 8, 9, 10, 11 of a configured effective carrier channel may be determined.

In step B1, a carrier data rate fb=1.28 MHz may be selected. As M=6, a computing rate fm of the apparatus=6*fb=7.68 MHz may be selected.

In step B2, a data sample length L=8192 may be selected. (Under Up Conversion of a multiple N=64, the original baseband 128 pts become 8192 pts after interpolation.)

In step B3, according to effective carrier information configured in A, 128-pt sampling may be performed respectively and carrier power p0, p1, p2, ..., p5 corresponding to channel numbers 0, 1, 2, ..., 5 of the effective carrier channels may be computed.

In step B4, the total power Pa of the effective carriers at the L points may be computed. Pa=−15 dbfs, for example.

In step C1, a power compensating search table may be made according to carrier configuration in A and a maximal total power Pmax allowed by the system. Assume that M=12, Pmax=−15 dbfs, for example. An inter-entry difference may be 0.1 dB, with a total of 150 entries. (With a total power less than −30 dbfs, no CFR is performed, as it is deemed that no adjustment is required.)

In step C2, a compensating entry Ga=0.995 in C1 may be found according to a result Pa=−15 dbfs calculated in B.

In step C3, an adjusted power value Po=−15.022 dbfs may be obtained as a product of Ga=0.995 and Pa=−15 dbfs, and sent into a DPD module.

To sum up, a technical solution provided herein has technical effects as follows.

1, power computation is moved forward, ahead of an Up Conversion module; inherent delays of DUC and CFR modules may be fully exploited to cancel out an amount of time as required by power computation, such that a system delay may be lowered effectively, in theory lowering the delay to L/fb.

2, an amount of computation as required by power computation may be greatly lowered, too. The amount of computation as required herein may be M*fb, whereas N*fb will be required with a convention solution. The N may be an Up Conversion interpolation multiple. In general, the N is far greater than the M.

Although elaborated as above, the disclosure is not limited thereto. Those skilled in the art may make various modifications according to the principle herein. Therefore, any modification, equivalent replacement, improvement, and the like made according to the principle of the present disclosure should be included in the scope of the present disclosure.

INDUSTRIAL APPLICABILITY

According to an embodiment herein, effective carrier information including an effective carrier channel corresponding to an effective carrier is obtained according to preconfigured system carrier information; carrier data on an effective carrier channel is sampled according to the obtained effective carrier information, and then total power Pa of effective carriers before Digital Up Conversion (DUC) or before digital Crest Factor Reduction (CFR) is determined according to sampled carrier data on effective carrier channels; power adjustment is performed before DPD using the total power Pa of the effective carriers. In this way, power computation is moved forward, ahead of an Up Conversion module; inherent delays of DUC and CFR modules may be fully exploited to cancel out an amount of time as required by power computation, effectively lowering a system delay.

The invention claimed is:

1. A method for power adjustment based on low-delay power detection before Digital Pre-Distortion (DPD), the method comprising steps of:

obtaining, by a power management computing device, effective carrier information including an effective carrier channel corresponding to an effective carrier based on preconfigured system carrier information, wherein the effective carrier is a carrier bearing information;

sampling, by the power management computing device, carrier data on an effective carrier channel based on the obtained effective carrier information;

determining, by the power management computing device, total power of effective carriers before Digital Up Conversion (DUC) or before digital Crest Factor Reduction (CFR) based on the sampled carrier data on the effective carrier channel; and performing, by the power management computing device, power adjustment using the total power of the effective carriers prior to DPD by searching a power compensating search table for a compensating entry corresponding to the total power of the effective carriers and determining according to the compensating entry, an adjusted power value to be sent into a DPD module.

2. The method according to claim 1, wherein the sampling the carrier data on the effective carrier channel comprises:

selecting, by the power management computing device, data sample points corresponding to a carrier data rate used; and sampling, by the power management computing device, at the data sample points, carrier data before DUC on the effective carrier channel.

3. The method according to claim 2, wherein the determining the total power of effective carriers before Digital Up Conversion (DUC) or before digital Crest Factor Reduction (CFR) comprises:

calculating, by the power management computing device, using power of sampled carrier data at the data sample points on the effective carrier channel, an average carrier power of the effective carrier channel; and obtaining, by the power management computing device, the total power of the effective carriers by summing average carrier power over the effective carrier channels.

4. The method according to claim 2, wherein the determining the total power of effective carriers before Digital Up Conversion (DUC) or before digital Crest Factor Reduction (CFR) comprises:

obtaining, by the power management computing device, the total power of the effective carriers at a data sample point by summing power of carrier data sampled at the data sample point over the effective carrier channels; and obtaining, by the power management computing device, the total power of the effective carriers by averaging the total power of the effective carriers at the data sample points.

5. The method according to claim 1, wherein the sampling the carrier data on the effective carrier channel comprises:

selecting, by the power management computing device, data sample points according to a carrier data rate and a DUC interpolation multiple; and sampling, by the power management computing device, at the data sample points, carrier data after DUC on the effective carrier channel.

6. The method according to claim 5, wherein the determining the total power of effective carriers before Digital Up Conversion (DUC) or before digital Crest Factor Reduction (CFR) comprises:

calculating, by the power management computing device, average carrier power of the effective carrier channel using power of sampled carrier data at the data sample points on an effective carrier channel; and obtaining, by the power management computing device, the total power of the effective carriers by summing average carrier power over the effective carrier channels.

7. The method according to claim 5, wherein the determining the total power of effective carriers before Digital Up Conversion (DUC) or before digital Crest Factor Reduction (CFR) comprises:

obtaining, by the power management computing device, the total power of the effective carriers at a data sample point by summing power of carrier data sampled at the data sample point over the effective carrier channels; and obtaining, by the power management computing device, the total power of the effective carriers by averaging the total power of the effective carriers at the data sample points.

8. The method according to claim 1, wherein the adjusted power value equals to a product of the total power of the effective carriers and the compensating entry.

9. A power management computing device comprising a processor and a memory coupled to the processor which is configured to be capable of executing programmed instructions comprising and stored in the memory to:

obtain effective carrier information including an input data channel corresponding to an effective carrier based on preconfigured system carrier information, wherein the effective carrier is a carrier bearing information;

sample carrier data on an effective carrier channel based on the obtained effective carrier information;

determine total power of effective carriers before Digital Up Conversion (DUC) or before digital Crest Factor Reduction (CFR) elimination based on the sampled carrier data on the effective carrier channel; and perform power adjustment using the total power of the effective carriers prior to DPD by searching a power compensating search table for a compensating entry corresponding to the total power of the effective carriers and determining, according to the compensating entry, an adjusted power value.

10. The device according to claim 9, wherein the sampling the carrier data on the effective carrier channel comprises:

selecting data sample points corresponding to a carrier data rate used, and sampling, at the data sample points, carrier data before DUC on the effective carrier channel; and determining the total power of the effective carriers before DUC or before Digital CFR based on the sampled carrier data on the effective carrier channels.

11. The device according to claim 9, wherein the sampling the carrier data on the effective carrier channel comprises:

selecting data sample points according to a carrier data rate and a DUC interpolation multiple, and sampling, at the data sample points, carrier data after DUC on the effective carrier channel; and determining, according to the sampled carrier data on the effective carrier channels, the total power of the effective carriers before DUC or before Digital CFR.

\* \* \* \* \*